(12) United States Patent
Kolsrud et al.

(10) Patent No.: US 6,377,196 B1
(45) Date of Patent: Apr. 23, 2002

(54) METHOD AND APPARATUS FOR ANALOG-TO-DIGITAL CONVERSION USING ATTENUATED ANALOG SIGNALS

(75) Inventors: Arild Kolsrud, Bridgewater; Carmine James Pagano, II, Blairstown, both of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/616,759

(22) Filed: Jul. 14, 2000

(51) Int. Cl.⁷ .............................. H03M 1/06; H03M 1/20
(52) U.S. Cl. ........................................ 341/118; 341/131
(58) Field of Search ................................ 341/120, 155, 341/156, 165, 118, 102, 143, 131

(56) References Cited

U.S. PATENT DOCUMENTS

| | | | | |
|---|---|---|---|---|
| 3,981,005 A | * | 9/1976 | Takayama et al. | 341/139 |
| 4,914,439 A | * | 4/1990 | Nakahashi et al. | 341/131 |
| 5,165,100 A | | 11/1992 | Hsieh et al. | |
| 5,379,445 A | | 1/1995 | Arnstein et al. | |
| 5,422,643 A | * | 6/1995 | Chu et al. | 341/141 |
| 6,031,478 A | * | 2/2000 | Oberhammer et al. | 341/155 |
| 6,268,820 B1 | * | 7/2001 | Sherry et al. | 341/155 |

* cited by examiner

Primary Examiner—Patrick Wamsley

(57) ABSTRACT

An analog-to-digital (A/D) converter system which converts an attenuated analog input signal into a digital value and shifts the position of the digital value within the digital output depending on the attenuation of the analog input signal. For example, in response to an analog input signal which saturates a first A/D converter, a second A/D converter receives and converts an attenuated analog input signal, and the output of the second A/D converter is used to produce the more significant bits of the digital output value to convert a higher amplitude range (power or voltage level range) for the analog input signal. In another example, a level detector can detect the amplitude of the analog input signal and provide an indication of the amplitude of the analog input signal. In response, the analog input signal is attenuated and provided to an A/D converter. The A/D converter converts the attenuated analog input signal and produces a digital value as the bits of the digital output where the position of the digital value within the digital output depends on the attenuation of the analog input signal.

16 Claims, 4 Drawing Sheets

METHOD AND APPARATUS FOR ANALOG-TO-DIGITAL CONVERSION USING ATTENUATED ANALOG SIGNALS

BACKGROUND OF THE INVENTION

1. Field of the Invention

This invention relates to analog-to-digital converters and, more particularly, to an analog-to-digital converter system for correcting the overload of an analog to digital (A/D) converter.

2. Description of Related Art

Many physical devices generate output signals which are analog or continuously varying. Today, signal processing is often accomplished using digital methods. In many applications it is required to convert an analog signal into a digital form suitable for processing by a digital system. Many types of converters exist which act as interfaces between analog devices and digital systems. These converters are used in a variety of applications, including testing, measurement, process control, and communications. Analog-to-Digital (A/D) converters produce a digital output from an analog input. In converting analog signals to digital form, the analog signal is typically sampled and quantized. When the analog input signal to the A/D converter reaches above the full scale voltage level producing the maximum digital output value for the A/D converter, the A/D converter becomes saturated or overloaded. Once the A/D converter is saturated, the digital output cannot go above the maximum digital output value which is limited by the number of bits available at the output of the A/D converter. As the analog input signal increases above the full scale voltage level, the sudden clipping in the digital output pattern results in a massive spurious response or undesirable distortion, which can be referred to as a discontinuity, in the digital domain when a Fourier transform is taken of the digital output signal resulting from the analog input signal with the sudden clipping of the amplitude.

SUMMARY OF THE INVENTION

The present invention involves an analog-to-digital (A/D) converter system which converts an attenuated analog input signal into a digital value and shifts the position of the digital value within the digital output depending on the attenuation of the analog input signal. For example, in response to an analog input signal which saturates a first A/D converter, a second A/D converter receives and converts an attenuated analog input signal, and the output of the second A/D converter is used to produce the more significant bits of the digital output value to convert a higher amplitude range (power or voltage level range) for the analog input signal. In another example, a level detector can detect the amplitude of the analog input signal and provide an indication of the amplitude of the analog input signal. In response, the analog input signal is attenuated and provided to an A/D converter. The A/D converter converts the attenuated analog input signal and produces a digital value as the bits of the digital output where the position of the digital value within the digital output depends on the attenuation of the analog input signal.

BRIEF DESCRIPTION OF THE DRAWINGS

Other aspects and advantages of the present invention may become apparent upon reading the following detailed description and upon reference to the drawings in which.

DETAILED DESCRIPTION

Figure 1:
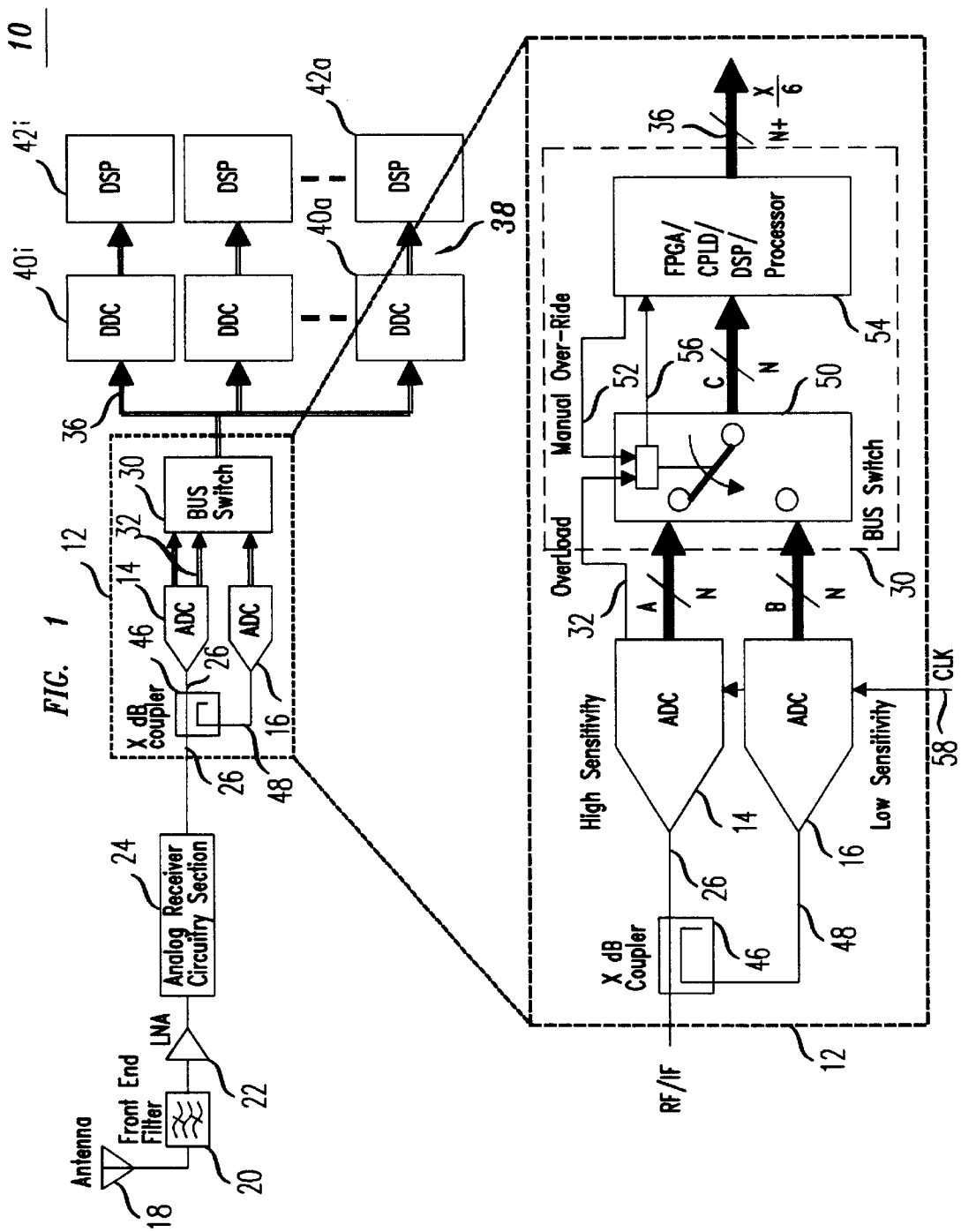
FIG. 1 shows a general block diagram of an embodiment of the A/D system according to principles of the present invention.

Illustrative embodiments are described below of an analog to digital (A/D) converter system which reduces the problems associated with the analog-to-digital conversion of high amplitude analog signals, for example an analog input signal having an amplitude above the full scale input range of an A/D converter. With particular reference to FIG. 1, a receiver system 10 includes an A/D converter system 12 which receives an analog signal to be converted into digital form by at least a first analog to digital (A/D) converter 14. Upon an indication that the first A/D converter 14 is saturated or overloaded by the analog input signal, the A/D converter system 12 produces a digital output using a digital value from a second analog to digital (A/D) converter 16. The second A/D 16 converts an attenuated replica of the analog input signal, and the A/D system 10 positions the digital value from the second A/D 16 as more significant bits of the digital output. As such, the second A/D 16 converts a higher amplitude range of the analog input signal, and the digital value of the second A/D 16 is given more significance within the digital output.

In this embodiment, radio frequency (RF) analog signals are received by antenna 18, and a front end-filter 20, such as a band-pass filter, filters the RF analog signals before being provided to a low noise amplifier (LNA) 22. The LNA 22 amplifies the analog signals and provides the analog signals to analog receiver circuitry 24. The A/D converter system 12 receives the analog signals to be digitally converted from the analog receiver circuitry 24. In the embodiment shown in FIG. 1, the A/D converter system 12 provides the analog signals to a main path 26 for digital conversion by the first or main A/D converter 14. If the A/D converter 14 is not overloaded, for example as indicated by an overload or over-range line 32 or by the output of the A/D converter 14, correction or processing circuitry 30 receives the digital values from the first A/D converter 14 and provides the digital values from the first A/D converter 14 as the least significant bits of the digital output on a bus 36. The correction circuitry 30 can be implemented using a bus switch. If the A/D converter 14 is overloaded, for example as indicated by the overload line 32 or by an examination of the output bit pattern of the A/D converter 14, the correction circuit 30 selects the digital output values from the second A/D converter 16 and provides the digital values from the second A/D converter 14 as the most significant bits of the digital output to the bus 36. The bus 36 provides the digitized signals to the digital radio circuitry 38, for example digital downconverters (DDCs) 40a–i connected to associated digital signal processors (DSPs) 42a–i.

In this embodiment, the main A/D 14 receives the analog signals from the direct path 26 of a coupler 46 with little attenuation, for example 0.5 dB. Accordingly, the main A/D 14 has a high sensitivity to the analog signals and produces N bits of resolution in converting the lower amplitude range analog input signals into the digital domain. The auxiliary A/D converter 16 receives the analog signals from the coupled or auxiliary path 48 which are attenuated by X dB.

Due to the X dB of attenuation of the analog input signals provided by the coupler 46, the auxiliary A/D 16 has a low sensitivity to the analog signals. The power level range relative to the analog input signal of the auxiliary A/D 16 is higher by X dB relative to the power level range of the first A/D converter 14 relative to the analog input signal due to the power offset introduced by the coupler 46 to the analog signals. In the embodiment of FIG. 1, the power level range of the second A/D converter 16 is skewed by X dB using the X dB coupler 46 on the path 26. The coupler 46 provides on a auxiliary or second path 48 a replica of the analog signals from the path 26 which are attenuated by X dB. The coupler 46 also outputs the analog signals onto the main path 26 with little attenuation for the first A/D converter 14. If the amplitude of the analog signals provided to the first A/D converter 14 is such that the,A/D converter is overloaded, the correction circuit 30 selects the digital value output of the second or auxiliary A/D converter 16 to be placed on the bus 36. In this embodiment, the auxiliary A/D 16 produces N bits of resolution in converting the higher amplitude range analog signals. The auxiliary A/D converter 16 does not saturate because the amplitude of the analog signals on the path 48 is attenuated by X dB, thereby the signal peak is detected without clipping or discontinuity.

In this embodiment, the correction circuit 30 can be implemented using a bus switch 50 responsive to an overload line 32 from the main A/D 14. In response to the overload line 32 or a manual override line 52 from processing block 54, the bus switch 50 selects the N bit digital value output from one of the main and auxiliary A/Ds 14 or 16. The bus switch 50 provides the digital value from the selected A/D 14 (A) or 16 (B) to the processing block 54 along with an indication of the selected A/D 14 or 16. If the main A/D 14 is not in overload or the manual override line 52 from the processing block 54 is activated, the bus switch 50 provides the N bit digital value output from the main A/D 14 to the processing block 54. Additionally, a selection indicator line 56 can be provided to the processing block 54 to indicate that the output from the main A/D 14 is being provided to the processing block 54.

In this embodiment, the bus 36 has greater than the N bits provided by the main A/D 14. For example, the bus 36 can have N+X/6 bits where X is the relative offset or power detection level between the main and auxiliary A/Ds 14 and 16. For every 6 dB skew in the input power detection ranges between the main and auxiliary A/Ds 14 and 16, a one bit skew is assumed in the digital domain since 1 bit in the digital domain roughly corresponds to 6 dB in the analog domain. In other embodiments or applications, a one-bit skew in the digital domain can correspond to a different amplitude skew in the analog domain. If the main A/D 14 is not overloaded or overrided, the N-bit digital value output of the main A/D 14 is provided to the processing block 54 by the bus switch 50, and the processing block 54 provides the N-bit digital value output of the A/D 14 as the N least significant bits of the bus 36. If the main A/D 14 is in overload and the override line 52 is not active, the bus switch 50 provides the N bit digital value output from the auxiliary A/D 16 to the processing block 54. Additionally, the selection indicator line 56 can indicate to the processing block 54 that the digital value from the auxiliary A/D 16 is being provided to the processing block 54. In this embodiment, the processing block 54 produces the digital value from the auxiliary A/D 16 as the N most significant bits of the digital output on the bus 36. The processing block 54 can be implemented as a software-driven digital signal processor (DSP), microprocessor microcontroller, a programmable logic device (e.g. a programmable gate array) or application specific integrated circuit (ASIC).

In an example of the embodiment of FIG. 1, the main A/D converter 14 and the auxiliary A/D converter 16 are 12 bit A/Ds having power detection ranges which are skewed or offset by 12 dB. The main A/D converter 14 converts the lower power level range for the analog signals and the second A/D converter 16 converts the higher power level range for the analog signals. To accomplish this, the coupler 46 can be made a 12 dB coupler. The 12 dB offset corresponds to a 2-bit offset in the digital domain because 6 dB in the analog domain corresponds roughly to 1 bit in the digital domain. If the bus 36 is a 14 bit bus (12+12/6) and the main A/D is not overloaded, the digital value output of the main or first A/D 14 is selected by the bus switch 50 and provided to the processing block 54. The processing block 54 provides the 12 bit output from the main A/D 14 as the lower 12 least significant bits (LSB) on the bus 36 while the two most significant bits are set low. If the main A/D 14 is saturated, the bus switch 50 detects the overload by receiving an indication of the overload from the main A/D converter 14. In response to the indication of overload, the bus switch 50 switches to the digital value output from the auxiliary A/D 16 and provides the digital value output from the auxiliary A/D 16 as the upper 12 most significant bits (MSB) of the digital output on the bus 36 while the two least significant bits are set high in this embodiment. In this embodiment, the 12 bit digital value from the main and auxiliary A/Ds 14 and 16 are available to the bus switch 50 as determined by a clock signal (CLK) 58. As such, the A/Ds 14 and 16 are synchronized by the clock signal (CLK) 58. After the processing block 54 provides the appropriate 14 bit digital output on the bus 36, the DDCs 40*a–i* process the 14 bit digital output on the bus 36.

Figure 2:
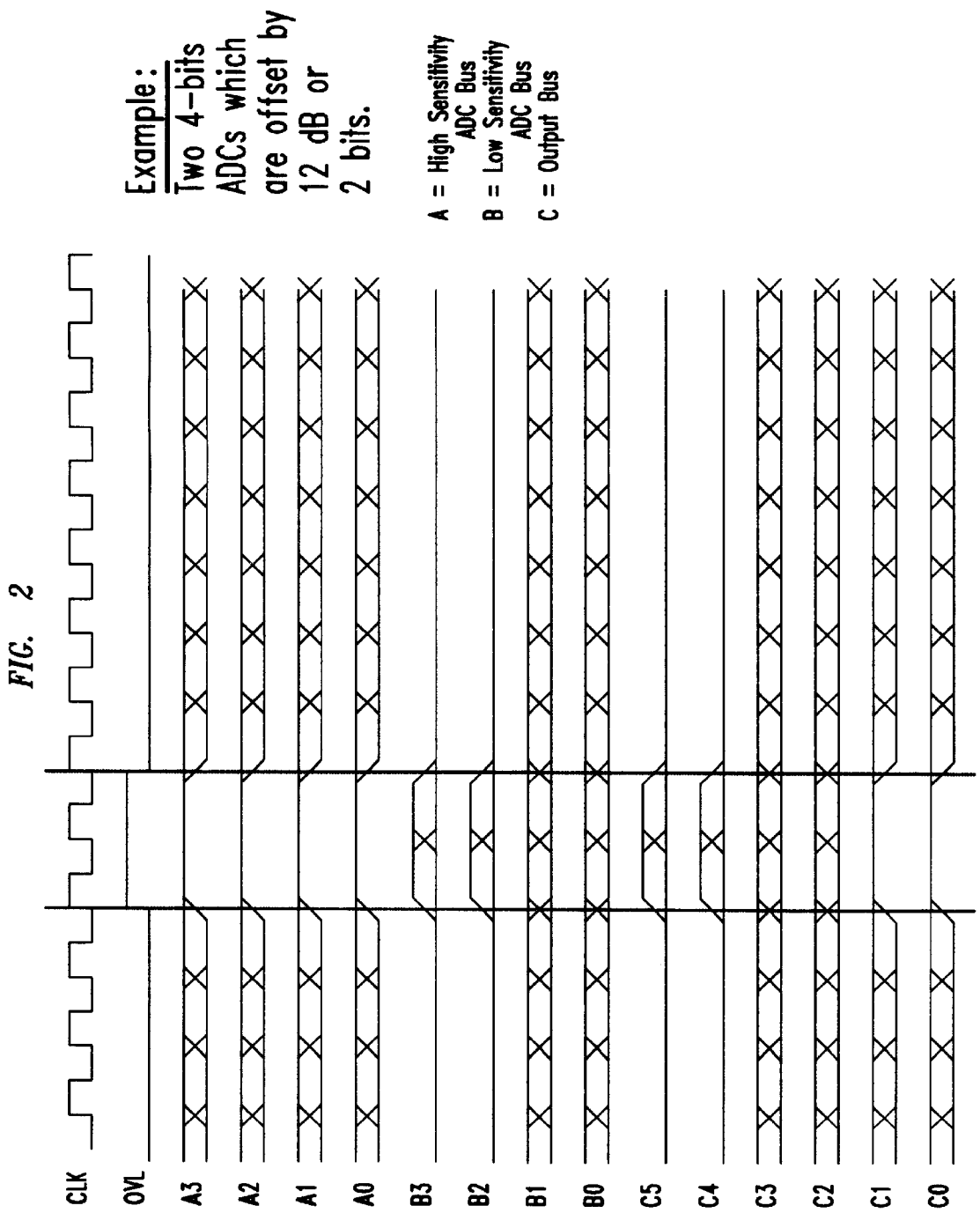
FIG. 2 shows a timing diagram for an embodiment of the present invention.

FIG. 2 shows a timing diagram for another embodiment of the A/D system 10 where the main A/D 14 has a 4 bit digital value output (A0–A3), and the auxiliary A/D 16 has a 4 bit digital value output (B0–B3). The analog input power ranges for the main and auxiliary A/Ds 14 and 16 are offset by 12 dB or 2 bits in the digital domain. Accordingly, the adjustment circuitry 30 of the A/D system 12 provides the selected digital values to a bus of 6 bits (C0–C5). In this embodiment, when the overload signal (OVL) 32 is low (indicating the main A/D is not overloaded), the correction or processing circuitry 30 produces the output A0–A3 of the main A/D 14 as the 4 least significant bits (C0–C3) of the bus 36, and the two MSBs (C4 and C5) of the bus are set low. When the OVL signal goes high (indicating that the main A/D 14 is overloaded), the correction circuitry 30 produces the digital value output (B0–B3) of the auxiliary A/D 16 as the 4 most significant bits (C2–C5) of the digital output on the bus 36, and the two LSBs (C0–C1) of the bus are set high. Because the main A/D 14 is overloaded, the output (A0–A3) of the main A/D 14 are shown high, and depending on the embodiment, the two LSBs (A0–A1) of the auxiliary A/D 16 could be used as the two LSBs (C0–C1) of the bus when the OVL is high. Also, depending on the DDC and/or DSP, the two LSBs could be set low when the main A/D 14 is saturated. After the OVL signal goes back low, the 4 bit digital value output (A0–A3) of the main A/D 14 is used as the 4 LSBs (C0–C3) of the 6 bit digital output on the bus, and the two MSBs (C4–C5) are set back low.

Thus, the A/D adjustment system according to the principles of the present invention provides or enables the digital conversion of higher amplitude analog signals by converting the higher amplitude portions or ranges of the analog input signal as the more significant bits of the digital output value while sacrificing the lower amplitude portion of the analog input signal and thereby the lower significant bits of the digital output. Accordingly, the significance of the bits of the bits from the A/D converter depends on the attenuation of the analog input signal. If no attenuation is performed, the bits from the A/D converter represent the least significant bits of the digital output value. If the analog input signal is attenuated in response to the amplitude of the analog input signal, the bits from the A/D converter are shifted to more significant bits in the digital output. Depending on the embodiment, the significance of the bits in the digital output can depend on the amount of attenuation of the analog input signal.

Figure 3:
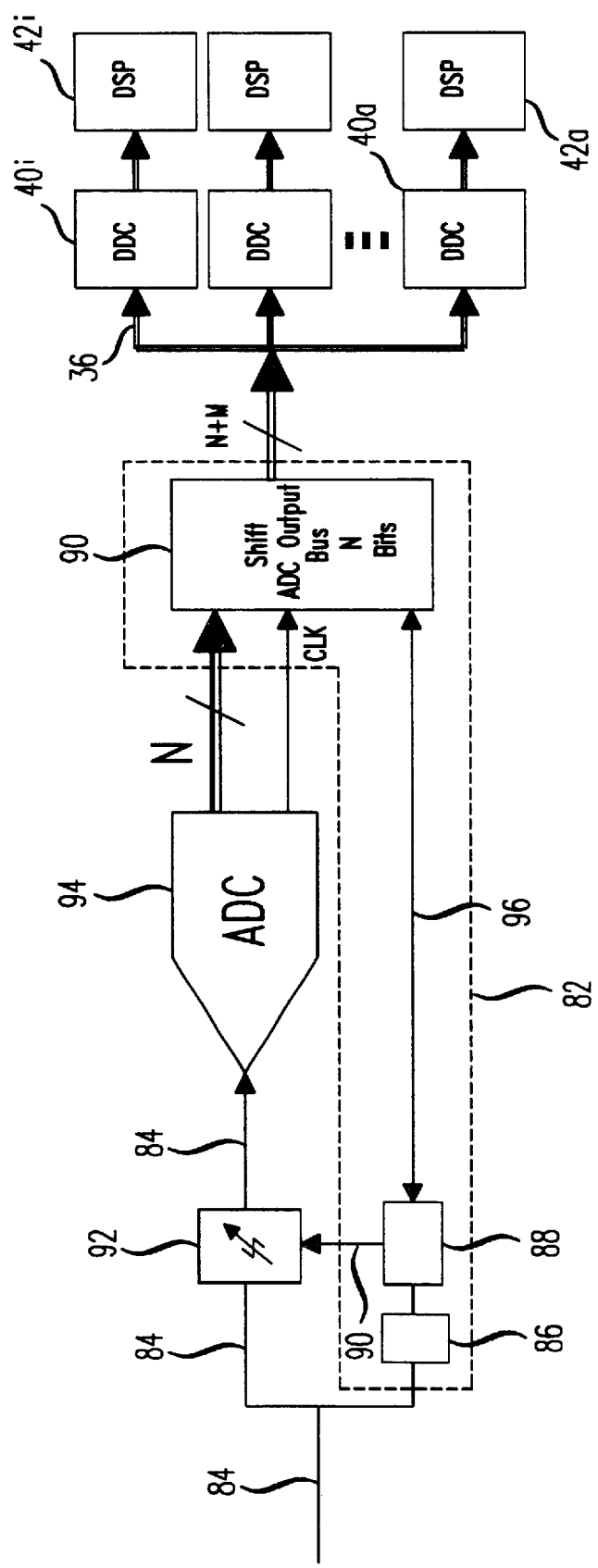
FIG. 3 shows a general block diagram of an alternative embodiment of the A/D system according to principles of the present invention.

FIG. 3 shows an alternative embodiment 80 of the A/D system including processing circuitry 82 which samples an analog input signal on a main signal path 86. In response to the amplitude of the analog input signal, the processing circuitry 82 provides a control signal 90 to an attenuator 92, such as a variable attenuator, which attenuates the analog input signal on the main signal path 84. In this embodiment, the processing circuitry 82 includes an amplitude detector 86 which produces a signal representative of the amplitude of the analog input signal to control circuitry 88. The control circuitry 88 provides the control signal 90 to the attenuator 92 in response to the amplitude of the analog input signal. The attenuated analog input signal from the attenuator 92 is digitally converted by an A/D converter 94 to produce an N-bit digital value. The processing circuitry 82 produces the digital value as bits having a significance depending on the amount of attenuation of the analog input signal. In this embodiment, the control circuitry 88 provides a control signal 96 to a bus switch 98 which shifts the bits of the digital value onto the bus 36 where the bus carries N+m bits where m>=1.

For example, if the bus 36 is a 14 bit bus and the A/D produces a 12 bit digital value, the processing circuitry 82 can produce the 12 bit digital value as the 12 most significant bits of the 14 bit digital output on the bus 36 if the analog input signal is at an amplitude level where the analog input signal is attenuated by 12 dB. If the amplitude of the analog input signal is within the full scale of the A/D converter, the 12 bit digital value of the A/D converter can be the least significant 12 bits of the 14 bit digital output. Depending on the embodiment, intermediate levels of attenuation can be provided which produce intermediate levels of significance for the digital values. For example, if the amplitude of the analog input signal is above the full scale of the A/D converter 94 but below the level which triggers 12 dB of attenuation, the attenuator 92 can attenuate the analog input signal by 6 dB and provide the 12 bit digital value as the middle 12 bits of the 14 bit digital output.

Figure 4:
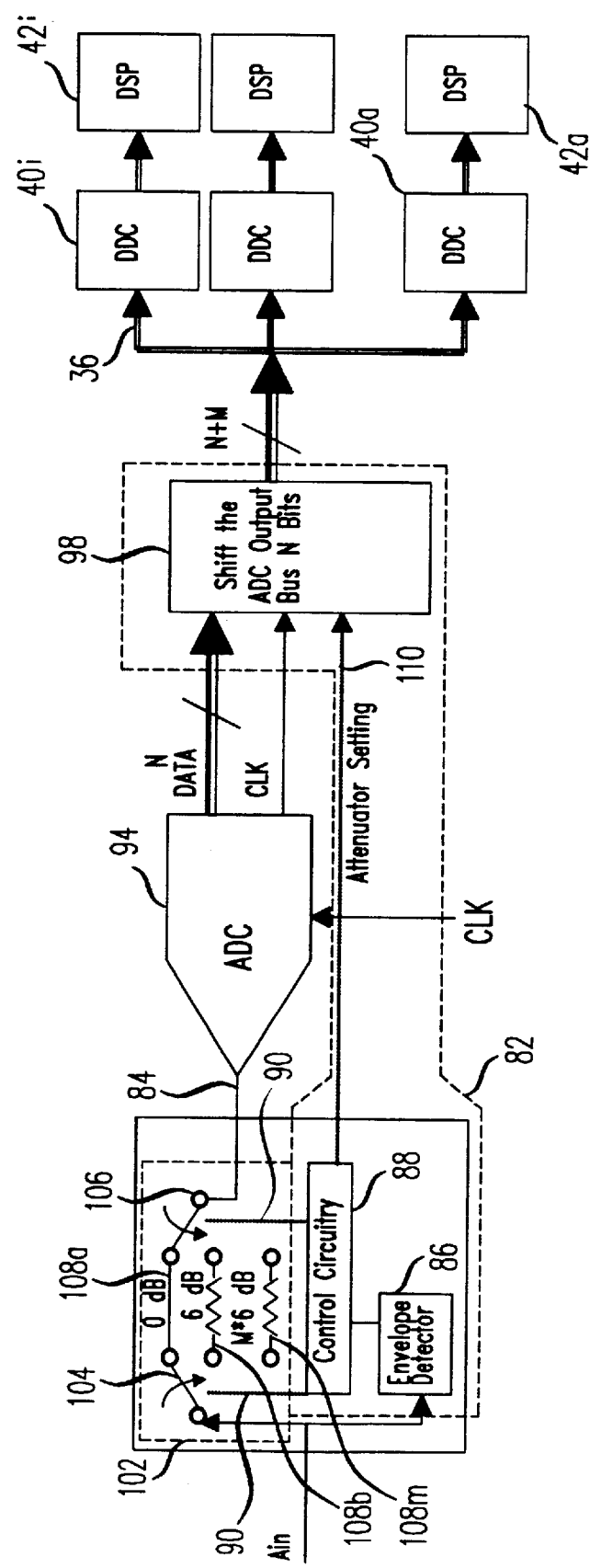
FIG. 4 shows a more detailed block diagram of an alternative embodiment of the A/D system according to principles of the present invention.

FIG. 4 shows an embodiment 100 of the A/D system which shifts the position of the digital value of the A/D converter 94 within the digital output depending on the amount of attenuation of the analog input signal. For example, where like reference numerals indicate like components, the analog input signal Ain, such as a carrier signal(s) with an information signal(s) modulated thereon, is received by a variable attenuator 102. An amplitude or envelope detector 86 samples the analog input signal and provides a signal indicating the amplitude of the analog input signal to the control circuitry 88. Based on the amplitude of the analog input signal, the control circuitry 88 provides control signal(s) 90 to the variable attenuator 102 to apply different levels of attenuation to the analog input signal. In this embodiment, the control signal(s) 90 control switches 104 and 106 which in response to the control signal(s) 90 switches the analog input signal between different attenuation paths 108a–m. In this embodiment, the first attenuation path 108a provides 0 dB of attenuation or no attenuation. The second path 108b provides 6 dB of attenuation to the analog input signal, and the last path 108m provides m*6 dB of attenuation to the analog input signal. In this embodiment, the attenuation levels of the paths 108b–m are provided in multiples of 6 dB because, in general for this application, about 6 dB in the analog domain corresponds to about 1 bit in the digital domain. Other attenuation levels are possible which correspond to a shift in bit(s) in the digital domain.

If the amplitude of the analog input signal is above a first level, for example above the full scale of the A/D converter 94, the control circuitry 88 provides a attenuation level to the analog input signal which in this embodiment is a multiple m of 6 dB. Full scale can be selectable on some devices, for example at 0.5 volts peak-to-peak, 1 volt peak-to-peak or 2 volts peak to peak. In this embodiment, each attenuation path 108b–m handles an amplitude range for the analog input signal. For example, if the analog input signal is above the first amplitude level and below a second amplitude level, the analog input signal is attenuated by 6 dB on the second path 108b. If the analog input signal is above the second amplitude level and below a third amplitude level, the analog input signal is attenuated by an attenuation path (not shown) by 12 dB and so on.

In this embodiment, the control circuitry 88 provides to the bus switch 98 a signal 110 corresponding to the attenuator setting. In response to the attenuator setting, the bus switch 98 shifts the position of the digital value of the attenuated analog input signal from the A/D converter 94 to positions corresponding to the attenuation of the analog input signal within the digital output on the bus 36. For example, if the analog input signal is not attenuated, the N bit digital value from the A/D converter 94 is the least significant N bits of the M bit bus 36, where M=N+m. If the analog input signal is attenuated by 6 dB, the N bit digital value from the A/D converter 94 is shifted by one bit (as the multiple of 6 dB of attenuation) within the M bit digital output. If the analog input signal is attenuated by 12 dB, the N bit digital value is shifted by two bits (2*6 dB=12 dB) within the M bit digital output. If the analog input signal is attenuated by m*6 dB, the N bit digital value from the A/D converter 94 is shifted by m bits from the N least significant bits by m bits to the N most significant bits.

Depending on the design parameters, the robustness of the design, and the particular application, different components could be used or components removed from the design. In addition to the embodiment described above, alternative configurations of the A/D system according to the principles of the present invention are possible which omit and/or add components and/or use variations or portions of the described system. For example, the overload adjustment system has been described as using first and second A/D converters, but alternative configurations are possible which use more then two A/D converters where each A/D converter converts an amplitude level range for an analog input signal. Upon an indication that an A/D converter is saturated the output from one or more of the A/D converters which convert the higher amplitude ranges of the analog input signal are used as the digital output value. The amplitude level ranges of the different A/D converters can overlap and/or be disjoint.

As would be understood by one of ordinary skill in the art, the various components making up the A/D system and their respective operating parameters and characteristics should be properly considered in designing the A/D system. For example, the A/Ds can be the same type of A/Ds, but different types of A/D could be used. Moreover, an A/D or A/Ds with lower and/or different bit resolution and saturation levels can be used at lower cost. The A/D system converts analog signals into digital form, and the analog signals or the level or amplitude thereof can be measured or represented in different ways, such as voltage, current, energy, power or intensity, but for discussion purposes, the amplitude of the analog signals in the digital domain can refer to the magnitude that the digital signal represents. In the analog frequency domain, the amplitude of the analog signals can refer to power level, and in the analog time domain, amplitude can refer to voltage level.

Furthermore, the A/D system has been described using a particular configuration of distinct components, but it should be understood that the A/D system and portions thereof can be implemented in application specific integrated circuits, software-driven processing circuitry, firmware, programmable logic devices, hardware or other arrangements of discrete components as would be understood by one of ordinary skill in the art with the benefit of this disclosure. Although in the illustrative embodiment is shown with a particular circuitry, the A/D system can use different components which together perform similar functions when compared to the circuitry shown. What has been described is merely illustrative of the application of the principles of the present invention. Those skilled in the art will readily recognize that these and various other modifications, arrangements and methods can be made to the present invention without strictly following the exemplary applications illustrated and described herein and without departing from the spirit and scope of the present invention.

What is claimed is:

1. A system for converting an analog signal to a digital output, comprising:
    a primary path for carrying said analog signal;
    a first analog to digital converter residing on said primary path that converts said analog signal into a first digital value;
    an auxiliary path for carrying an attenuated version of said analog signal;
    a second analog to digital converter residing on said auxiliary path that converts said attenuated version of said analog signal into a second digital value;
    correction circuitry connected to said primary and auxiliary paths, said correction circuitry configured to produce said digital output in response to one of said first and said second digital values; and
    an overload circuit connected to said primary path, said overload circuit configured to determine a state of said first analog to digital converter.

2. The system of claim 1 wherein said overload circuit is configured to determine whether said first analog to digital converter is in a saturated state.

3. The system of claim 2, wherein said overload circuit is configured to determine whether said first analog to digital converter is in a saturated state by examining all bits in said first digital value.

4. The system of claim 1 wherein said correction circuitry produces said digital output from said first digital value if said overload circuit determines that said first analog to digital converter is not in a saturated state, and wherein said correction circuitry produces said digital output from said second digital value if said overload circuit determines that said first analog to digital converter is in a saturated state.

5. The system of claim 1, wherein said correction circuitry comprises a bus switch.

6. The system of claim 1, further comprising:
    a coupler that receives said analog signal and passes said analog signal to said primary path, and wherein said coupler produces said attenuated version of said analog signal and passes said attenuated version of said analog signal to said auxiliary path.

7. The system of claim 1, wherein said attenuated version of said analog signal is attenuated by a multiple of 6 dB.

8. The system of claim 1, wherein said second analog to digital converter produces N bits of resolution in converting said attenuated version of said analog signal to a second digital value, and said correction circuitry produces said digital output having M bits of resolution, and wherein farther M is greater than N.

9. The system of claim 1, wherein said correction circuitry shifts said first or second digital value within said digital output based at least in part on a degree of attenuation of said analog signal.

10. A method for converting an analog signal to a digital output, comprising:
    receiving said analog signal on said input path;
    measuring an indication of an amplitude of said analog signal;
    attenuating said analog signal by switching said analog signal to a first attenuated path or a second attenuated path, wherein said switching is based at least in part on said indication of in amplitude of said analog signal;
    converting said attenuated analog signal to a digital value; and
    producing said digital output by shifting a bit position of said digital value based at least in part on said indication of an amplitude of said signal.

11. The method of claim 10, wherein the step of attenuating said analog signal comprises switching said analog signal to said first attenuated path, said second attenuated path or a third attenuated path.

12. The method of claim 10, wherein the step of attenuating said analog signal comprises switching said analog signal to only one of a plurality of attenuated paths.

13. A method of converting an analog signal to a digital output, said method comprising:
    receiving said analog signal on a primary path;
    receiving an attenuated analog signal on an auxiliary path;
    converting said analog signal to a first digital value using a first analog to digital converter residing on said primary path;
    converting said attenuated analog signal to a second digital value using a second analog to digital converter residing on said auxiliary path;
    testing said first digital value to determine whether said first analog to digital converter is in a saturated state; and
    producing said digital output based at least in part on said first digital value if said first analog to digital converter is not in a saturated state and producing said digital output based at least in part on said second digital value if said first analog to digital converter is in a saturated state.

14. The method of claim 13, wherein the step of receiving an attenuated analog signal comprises receiving an attenuated version of said analog signal.

15. The method of claim 13, wherein testing said first digital value to determine whether said first analog to digital converter is in a saturated state comprises testing every bit of said first digital value.

16. The method of claim 13, wherein the step of producing said digital output comprises shifting one of said first or second digital values based at least in part on an attenuation of said first or second analog signal.

* * * * *